United States Patent
Banach et al.

(10) Patent No.: US 8,684,779 B2
(45) Date of Patent: Apr. 1, 2014

(54) ELECTRODE PATTERNING

(71) Applicant: Plastic Logic Limited, Cambridge (GB)

(72) Inventors: Michael Banach, Cambridge (GB);
Thomas Meredith Brown, Rome (IT);
Carl Hayton, Cambridge (GB)

(73) Assignee: Plastic Logic Limited, Cambridge, Cambridgeshire (GB)

( * ) Notice: Subject to any disclaimer, the term of this patent is extended or adjusted under 35 U.S.C. 154(b) by 0 days.

(21) Appl. No.: 13/922,180

(22) Filed: Jun. 19, 2013

(65) Prior Publication Data

US 2013/0330850 A1 Dec. 12, 2013

Related U.S. Application Data

(63) Continuation of application No. 11/720,429, filed as application No. PCT/GB2005/050236 on Dec. 6, 2005, now abandoned.

(30) Foreign Application Priority Data

Dec. 6, 2004 (GB) .................................. 0426682.1
Apr. 7, 2005 (GB) .................................. 0507029.7

(51) Int. Cl.
*H01J 9/00* (2006.01)

(52) U.S. Cl.
USPC .............................................. 445/23; 445/49

(58) Field of Classification Search
USPC ............................. 445/23–25, 49–51; 438/22
See application file for complete search history.

(56) References Cited

U.S. PATENT DOCUMENTS

| 5,756,147 A | * | 5/1998 | Wu et al. ........................ 427/66 |
| 2002/0110673 A1 | | 8/2002 | Heydarpour et al. |
| 2002/0182890 A1 | | 12/2002 | Ishida et al. |
| 2002/0195928 A1 | * | 12/2002 | Grace et al. ................... 313/503 |
| 2006/0262260 A1 | * | 11/2006 | Majumdar et al. ............ 349/122 |

FOREIGN PATENT DOCUMENTS

| EP | 0687009 A2 | 12/1995 |
| EP | 0758192 A2 | 2/1997 |
| WO | WO 98/53510 | 11/1998 |
| WO | WO 2004/036663 A2 | 4/2004 |
| WO | WO 2004/070466 A2 | 8/2004 |

OTHER PUBLICATIONS

Bao, Z. et al. "High-Performance Plastic Transistors Fabricated by Printing Techniques," CHem. Mat 9, 1299-1301 (1997).*

(Continued)

*Primary Examiner* — Joseph L Williams
(74) *Attorney, Agent, or Firm* — Knobbe Martens Olson & Bear LLP

(57) ABSTRACT

A method is provided to isolated conductive pads on top of a multi-layer polymer device structure. The method utilizes laser radiation to ablate conductive material and create a non-conductive path, electrically isolating the conductive pads. The process is self-limiting and incorporates at least one layer within the stack that absorbs the radiation at the required wavelength. The prevention of radiation degradation of the underlying layers is achieved, as absorption of radiation occurs primarily on the surface of the structure, but not in any of the radiation sensitive underlying layers of the electronic device. The method preferably uses low energy infrared radiation which has been shown to produce little debris and no device degradation.

16 Claims, 9 Drawing Sheets

(56) References Cited

OTHER PUBLICATIONS

Babin, et al., "Absorption Spectra and the Nature of Complexes in the Polyvinyl Alcohol-Nickel (II) Chloride System" Journal of Applied Spectroscopy, pp. 1-3, vol. 73, No. 1, 2006.

International Search Report for International Application No. PCT/GB2005/050236, dated Apr. 27, 2006.

International Preliminary Report on Patentability with Written Opinion for International Application No. PCT/GB2005/050236, dated Jun. 13, 2007.

Summons to Attend Oral Proceedings Pursuant to Rule 115(1) EPC dated Sep. 9, 2011. Appl. No. 05815915.3, pp. 1-5.

* cited by examiner

ELECTRODE PATTERNING

CROSS-REFERENCE TO RELATED APPLICATIONS

This application is a continuation of U.S. patent application Ser. No. 11/720,429, with a 371(c) date of Jun. 16, 2008 and incorporated in its entirety by reference herein, and which is the U.S. National Phase under 35 U.S.C. §371 of International Appl. No. PCT/GB2005/050236, filed Dec. 6, 2005, designating the United States and published in English on Jun. 15, 2006, as WO 2006/061658, which claims priority to United Kingdom Appl. No. 0426682.1, filed Dec. 6, 2004 and United Kingdom Appl. No. 0507029.7, filed Apr. 7, 2005.

BACKGROUND

1. Field of the Invention

The present invention relates to methods of using radiation to pattern an electrode of an organic electronic device and to substrates for and processed by these methods. A preferred embodiment relates to a method of using laser radiation to isolate organic pixel electrodes on top of a multilayer device structure containing an array of active electronic devices such that the underlying layers are substantially unharmed and substantially no debris is generated.

2. Description of the Related Art

Backplanes for active matrix displays comprise an array of transistors that are individually addressed by interconnect lines perpendicular to an array of data lines. By driving both the interconnect lines and the data lines, a pixel pad or electrode is charged and a portion of the display medium above this pixel electrode will switch.

One problem that is shared between conventional thin film transistor (TFT) technology and organic semiconductor-based printed TFTs alike is the limited display area, in which the thin film transistor, the gate line, the pixel capacitor and the pixel itself compete with each other for space. This can lead to a reduction in the aperture ratio and therefore the quality of the display. The aperture ratio of the display is defined by the area of the pixel electrode divided by the area of the pixel footprint. Since the pixel electrode is competing with the TFT, interconnects and pixel capacitor for space in the pixel footprint, it is preferable to use a multi-level structure where the pixel electrode is defined on a different layer from the gate interconnect and data lines. When fabricating such an electrode it is advantageous to use an organic conductor because it can be processed from solution, which allows for low cost deposition techniques.

In a conventional display the silicon TFT source-drain electrodes, addressing lines and the pixel electrodes are on one metal level of the device, and the gate electrodes and gate addressing lines are on a second metal level of the device. In conventional display architectures, printed electrodes and printed pixel capacitors tend to be large and result in active matrix displays with low aperture ratios.

In our preferred structure, disclosed in patent number PCT/GB2004/000433, a method is provided for producing a thin film transistor device incorporating a three-metal-level architecture resulting in a high aperture ratio and allowing for a large pixel capacitor. The device is formed by methods of solution processing and direct printing.

We here describe a method for patterning the upper pixel electrode on top of a multi-level pixel structure without significant degradation of the underlying layers of the TFTs.

In the prior art, it is known that conductive inks are able to be patterned using a wide variety of printing techniques such as ink-jet printing; screen printing, and offset printing to produce pixel electrodes or pads. However, these are relatively low resolution techniques that rely heavily on the wetting properties of the printing surface.

Conductive pads can also be directly deposited on top of a multilayer stack using a laser induced forward transfer process. This process can be executed with an infrared laser in which case it is known as a thermal transfer process. Conducting polymer pads have been thermal transferred onto flexible substrates as explained by G. B. Blanchet et al in Applied Physics Letters 82(3) 2003 page 463. However, this process uses a transfer layer that would need to disposed of after it is used, and it is unlikely that laser transferred conductive material would fill the via hole which would be required for it to act as a pixel electrode.

It is known to use ultraviolet laser radiation for patterning; this is described in US20030092267A1. This teaches the use of ultraviolet laser radiation, which is absorbed by most polymer layers and could cause detrimental effects to the performance of the TFT's.

The prior art discussed above has many drawbacks. When laser ablation is applied to patterning of conducting layers on a substrate that already contains active electronic devices such as TFTs, diodes, or other semiconducting devices or active layers, the performance of these devices/layers is degraded when the laser ablation occurs close to or in upper layers of the electronic devices. This is particularly problematic with many organic semiconductor devices. Many molecular or conjugated polymer semiconductors exhibit degradation effects, such as a reduction of charge carrier mobility or generation of electronic defect states, when exposed to strong ultraviolet radiation. Using ultraviolet radiation as described in the prior art for top level patterning for multilayer polymer stacks will tend to cause damage of underlying layers. In addition, such ultraviolet radiation patterning has been shown to produce debris. The formation of debris can cause poor contact with the display medium and may lead to shorts between conductive pads.

A method is therefore needed to define and isolate organic electrodes on top of a multi-level polymer stack within a device without harming the underlying layers or producing excess debris.

SUMMARY

The present invention aims to provide an improved method for defining organic pixel electrodes on multi-level structures using a laser ablation type process. Embodiments have been shown to leave the underlying layers substantially unharmed and produce substantially no excess debris.

To address the problems outlined above we describe arrangements in which the layers in the polymer stack and the laser radiation are selected such that the radiation is absorbed either in the conducting layer itself or by an underlying layer that is between the organic electrode and the layers critical to the TFT. This removes conductive material in the regions that have been exposed to the radiation, therefore dividing the layer of conductive material into pixel electrode pads and isolating the devices.

According to a first aspect of the present invention there is therefore provided a method of forming a conductive element on an organic electronic structure on a substrate, the method comprising: depositing a layer of dielectric material on said organic electronic structure; and depositing a layer of conducting material over said layer of dielectric material; and wherein the method further includes: providing a light absorbing material over said organic electronic structure and under an upper surface of said layer of conducting material; and irradiating portions of the substrate with light absorbed by said light absorbing material such that said conducting material is selectively removed from said irradiated substrate portions.

The light absorbing material may comprise a dye, either in a separate layer or within a layer of dielectric material or the layer of conducting material, or either or both of the layer of dielectric material or the layer of conducting material may be selected to provide light absorption. Preferably the light absorbing material has an absorption at a laser wavelength and the substrate is irradiated at the laser wavelength. The skilled person will understand that although laser light sources are preferable other types of high intensity light source would also be employed. In some embodiments the laser wavelength is an infrared wavelength to reduce the risk of damage to the underlying organic electronic device. This wavelength may be selected so as not to be substantially absorbed by the organic electronic device or, more particularly, by functional layers within this device. In other embodiments ultraviolet light is employed. Preferably the dielectric material comprises a polymer dielectric. Preferably the dielectric material has a thickness of greater than 1 micron, more preferably greater than 3 microns.

Optionally a wetting surface may be included underneath the layer of conducting material, for improved adhesion of the conducting material; this may be provided by an additional wetting layer. Alternatively a de-wetting surface may be provided under the conducting material, optionally by an additional, de-wetting layer, so that when the conducting material and/or light absorbing material is heated by irradiation it melts and de-wets to provide a gap in the conducting layer.

The conducting layer preferably forms part of an electrode for a passive or active organic electronic device or an electrode line or interconnect such as a pixel electrode connection or a display. In some embodiments the conductor comprises an organic conductor, more particularly a conducting polymer such as PEDOT/PSS. However in other embodiments the conducting material may comprise an inorganic metal film. In some preferred embodiments the insulator has a relatively low thermal conductivity to further reduce the risk of damage to underlying layers. Such a pixel electrode may be electrically connected to an electrode of an underlying thin film transistor by a via hole connection.

In some embodiments the method is self-limiting so that in the main only light absorbing material and material above this is removed (the light absorption acting somewhat similarly to an etch stop). This process may be controlled, for example, by adjusting one or more of light absorption, dye concentration, irradiation energy (fluence), and laser wavelength.

In a related aspect the invention provides a substrate configured for conductive layer patterning using light, the substrate comprising: an organic electronic structure; a layer of dielectric material over said electronic device; and a layer of conducting material over said layer of dielectric material; and wherein the substrate further includes a light absorbing material over said organic electronic structure and under an upper surface of said layer of conducting material.

The light absorbing material may be provided in said dielectric layer, in said conducting layer, or in a separate layer under the conducting layer.

Preferably when irradiated from a side closest to the layer of conducting material (i.e. from above) by light, for example at a laser wavelength, the irradiating light is more strongly absorbed by the light absorbing material than by the organic electronic device.

The invention also provides a substrate as described above after irradiation of portions of the substrate at the laser wavelength, so that conducting material is substantially absent from irradiated substrate portions. Generally the light absorbing material in the irradiated substrate portions is also absent, or at least reduced compared to un-irradiated substrate portions.

According to a first class of embodiments of the present invention a method is provided for producing a pixel electrode which is defined by the isolation of conductive electrode pads on a polymer surface. A layered substrate is provided on which an insulating, dielectric layer is deposited on top of the active electronic devices. This is followed by the deposition of a light absorbing layer. An absorbing dye moiety may be added to the light absorbing layer to increase its optical density at the wavelength of laser light. Preferably, the light absorbing layer has an optical density exceeding 0.3-0.5 at the laser wavelength. A wetting layer may also be deposited to improve the wetting and adhesion of the conductive material subsequently deposited on top. The wetting layer may also be provided by the light absorbing layer. The layered stack is then irradiated by a laser beam such that the absorbing layer underlying the conductive layer melts or ablates away. This step removes the conductive pathway between two adjacent electrode pads resulting in the patterning of the conductive layer to produce pixel electrodes and isolated devices.

It is desirable that the laser light is absorbed primarily in the light absorbing layer, but not in any of the sensitive functional layers of the active electronic devices. This can be substantially achieved by selecting the wavelength of the laser to be in a spectral range in which the sensitive functional layers of the active electronic devices are essentially transparent. Furthermore, the laser light is preferably incident from the surface of the device, such that it is strongly attenuated before it passes through the layers of the active electronic devices. In this way, the method inhibits degradation of the underlying active layers of the electronic device even if the laser is patterning directly on top of the active electronic device. It also inhibits production of debris on the surface of the patterned conductive layer.

Any laser wavelength may be employed, and since intense light of tunable lasers are available for the uv, visible or ir parts of the spectrum, intense light of any wavelengths may be used.

However preferably the laser is of infrared (ir) wavelength, such as 830 nm or 1064 nm. The use of infrared light further minimizes the degradation of the underlying layers, as low-energy infrared light is less likely to induce photochemical changes in any of the active layers of the electronic device.

Embodiments of the method are also applicable to laser patterning in the visible and ultraviolet spectral range provided that care is taken to reduce the leakage of light to the active layers underneath the conducting layer, for example by giving consideration to this when selecting the light absorbing material.

According to a second class of embodiments of the present invention a method is provided for producing a pixel electrode which is defined by the isolation of conductive electrode pads on a polymer surface. A layered substrate is provided on which an insulating, dielectric layer is deposited on top of the active electronic device. This is followed by the deposition of a light absorbing conductive layer. An absorbing dye moiety may be added to the light absorbing conductive layer to increase its optical density at the wavelength of laser light. Preferably, the light absorbing layer has an optical density exceeding 0.3-0.5 at the laser wavelength. A wetting layer may also be deposited to improve the wetting and adhesion of the light absorbing conductive layer on top of the dielectric layer. The layered stack is then irradiated by a laser beam such that the light absorbing conductive layer melts or ablates away. This step removes the conductive pathway between two adjacent electrode pads resulting in the patterning of the conductive layer to produce pixel electrodes and isolated devices. Since the laser light is absorbed primarily in the light absorbing conductive layer, the method inhibits degradation of the underlying active electronic device even if the laser is patterning directly on top of the active electronic devices. It also inhibits debris on the surface of the patterned conductive layer.

Preferably the laser is of infrared wavelength, such as 830 nm or 1064 nm. The use of infrared light further inhibits the degradation of the underlying layers, as low-energy infrared light is less likely to induce photochemical changes in any of the active layers of the electronic device.

Embodiments of the method are also applicable to laser patterning in the visible and ultraviolet spectral range provided that care is taken to reduce the leakage of light to the active layers underneath the conducting layer, as mentioned above.

In a third class of embodiments of the invention a pixel electrode is defined by the isolation of electrode pads on a polymer surface by providing a thick dielectric layer deposited on top of the transistor array. The dielectric layer provided is optically thick, i.e. has a composition such that the laser light is strongly absorbed in the dielectric layer and does not irradiate the components of the underlying active elements with high light intensity. An absorbing dye moiety may be added to the dielectric layer to increase its optical density at the wavelength of laser light. The stack may then be irradiated by an infrared or ultraviolet laser beam such that the surface region of the aforementioned dielectric layer melts or ablates away. The laser beam does not completely penetrate the layer. The underlying layers are therefore protected. This step removes conductive material within this conductive layer to remove any conductive pathways between two adjacent electrode pads resulting in the isolation of the device.

The dielectric layer is preferably a material with a low heat conductivity, most preferably a polymer dielectric, such as PMMA, polystyrene of parylene. The low heat conductivity of the dielectric layer reduces thermal damage to the underlying device by the absorption of the laser light. Preferably the thermal conductivity of the dielectric is less than $1 \cdot 10^{-2}$ W/cm·K.

In at least the first two classes of embodiments, the process can be self-limiting in the sense that material is substantially only removed from the light absorbing layer itself, and from any of the layers above the light absorbing layer, but not substantially from any of the layers underneath. The underlying layers are not removed from the substrate or preferably even melted. This can be achieved by selecting the laser wavelength such that the laser light is not strongly absorbed by any of the sensitive functional layers of the active electronic device. In the case of infrared radiation many polymer semiconductors and dielectrics are substantially transparent to infrared light. Therefore, once the infrared light absorbing layer is ablated or removed no significant further ablation of underlying material occurs. In addition, this process has also been shown to produce very little excess debris.

In all three classes of embodiments the conductive layer can either be an inorganic metal deposited from vapour or liquid phase or an organic conductor. Most preferable the conductive material is a solution deposited conducting polymer. Compared to inorganic metals conducting polymers can be patterned with a lower laser energy. This helps to avoid degradation of the underlying structure.

BRIEF DESCRIPTION OF THE DRAWINGS

To help understanding of the invention, the invention will now be described by way of example and with reference to the accompanying drawings, in which.

DETAILED DESCRIPTION

Broadly we will describe examples of a method to isolate conductive pads on top of a multi-layer polymer device structure. The method utilizes laser radiation to ablate conductive material and create a non-conductive path, electrically isolating the conductive pads. The process is self-limiting and incorporates at least one layer within the stack that absorbs the radiation at the required wavelength. The prevention of radiation degradation of the underlying layers is achieved, as absorption of radiation occurs primarily on the surface of the structure, but not in any of the radiation sensitive underlying of the electronic device. The method preferably uses low energy infrared radiation which has been shown to produce little debris and no device degradation.

Example 1

Direct-Write Patterning of Top Conductive Electrode

Figure 1:
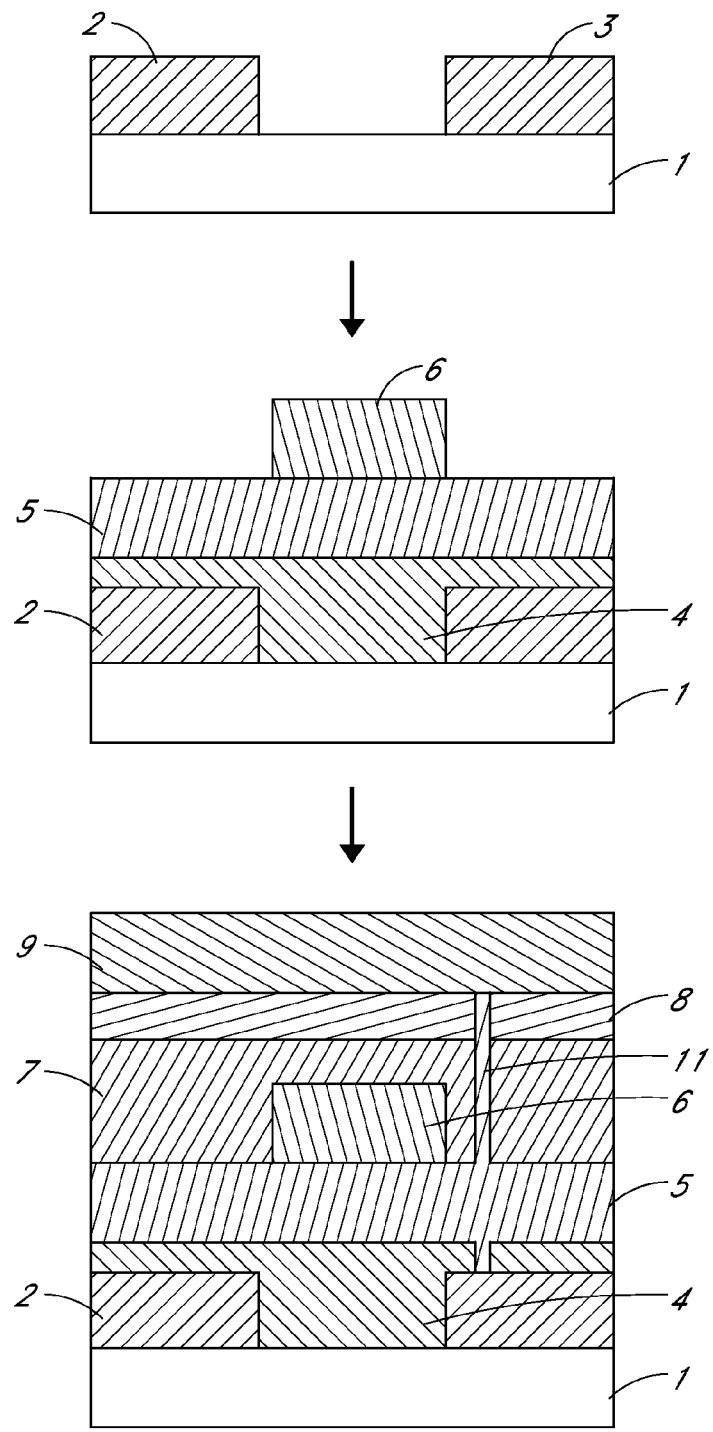
FIG. 1 illustrates a conventional method of producing a multi-level polymer stack.

The fabrication of a multi-level (or -layer) stack for polymer-based printed TFTs according to a conventional method is illustrated in FIG. 1. Conductive material is deposited and patterned on a substrate 1 to form source and drain electrodes 2. The substrate may be either glass or a polymer film, but preferably a plastic substrate such as polyethyleneterephtalate (PET) or polyethylenenaphtalene (PEN) is used. The patterned conductive layer 2 comprises a conducting polymer, such as PEDOT, or a metallic material, such as gold or silver. It may be deposited and patterned through solution processing techniques such as, but not limited to, spin, dip, blade, bar, slot-die, or spray coating, inkjet, gravure, offset or screen printing, or evaporation, and photolithography techniques.

Once the conductive layer has been patterned to form the source and drain electrodes, a layer of semiconducting material 4 may then be deposited over the substrate and patterned electrodes. The semiconducting layer may consist of materials such as, but not limited to, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Alternatively, the semiconducting layer may be deposited as a thin continuous film and patterned substractively by techniques such as photolithography (see WO 99/10939) or laser ablation.

A layer of gate dielectric material 5 is then deposited onto the layered substrate. Materials such as polyisobutylene or polyvinylphenol may be used as the dielectric material, but preferably polymethylmethacrylate (PMMA) and polystyrene are used. The dielectric material may be deposited in the form of a continuous layer, by techniques such as, but not limited to, spray or blade coating. However, preferably, the technique of spray coating is used.

The deposition of the dielectric layer is then followed by the deposition and patterning of a gate electrode 6 and interconnect lines. The material of the gate electrode may be a patterned thin film of inorganic metals such as gold or a pattern of printable inorganic nanoparticles of silver or gold, or a conducting polymer, such as polyethylenedioxythiophene doped with polystyrene sulfonic acid (PEDOT/PSS). The gate electrode is deposited using techniques such as sputtering or evaporation techniques or solution processing techniques such as spin, dip, blade, bar, slot-die, gravure, offset or screen printing. Preferably, the gate electrode is deposited using the solution processing technique of ink jet printing.

At least one further layer of dielectric material 7 is deposited on the substrate after the deposition of the gate electrode and interconnect and data lines. The dielectric material may be deposited from solution in the form of a continuous layer, by techniques such as, but not limited to, spin coating ink-jet printing, spray-coating, roller coating spray or blade coating. However, preferably, the technique of spray coating is used. The dielectric material may also be deposited using vapour phase deposition techniques like evaporation or chemical vapour deposition. The dielectric material is preferably deposited in such a way so that no degradation occurs to the underlying layers. A method to achieve this is disclosed in our previous patent application WO01/47043. In this, a method for forming a transistor was disclosed by depositing a first material from solution in a first solvent to form a first layer of the transistor; and subsequently whilst the first material remains soluble in the first solvent, forming a second layer of the transistor by depositing over the first material a second material from solution in a second solvent in which the first material is substantially insoluble. A suitable solution processible dielectric material that may be used as a second dielectric layer is polystyrene dissolved in xylene. In addition, parylene is an example of a dielectric material that may be deposited via chemical vapour phase deposition.

According to a conventional method (FIG. 1) the top level, pixel electrode 9 is deposited as a patterned film using a direct write printing technique such as inkjet printing of a conducting polymer. The pixel electrode is connected to the underlying drain electrode of the TFT through a via hole interconnection 11.

Techniques for via hole opening and via fabrication, and other selective connection formation techniques such as selective removal of layers, are described at pages 32 to 39 of WO 01/47043, with reference to FIGS. 12 to 15, which material is specifically incorporated by reference in this application.

This method has the disadvantage that in order to ensure the high yielding isolation of neighbouring pixels the distance between neighbouring pixel electrodes cannot be chosen less than typically 20 µm, which limits the achievable aperture ratio of the display.

Example 2

Patterning of the Top Conductive Layer Using a Light Absorbing Layer

Figure 2:
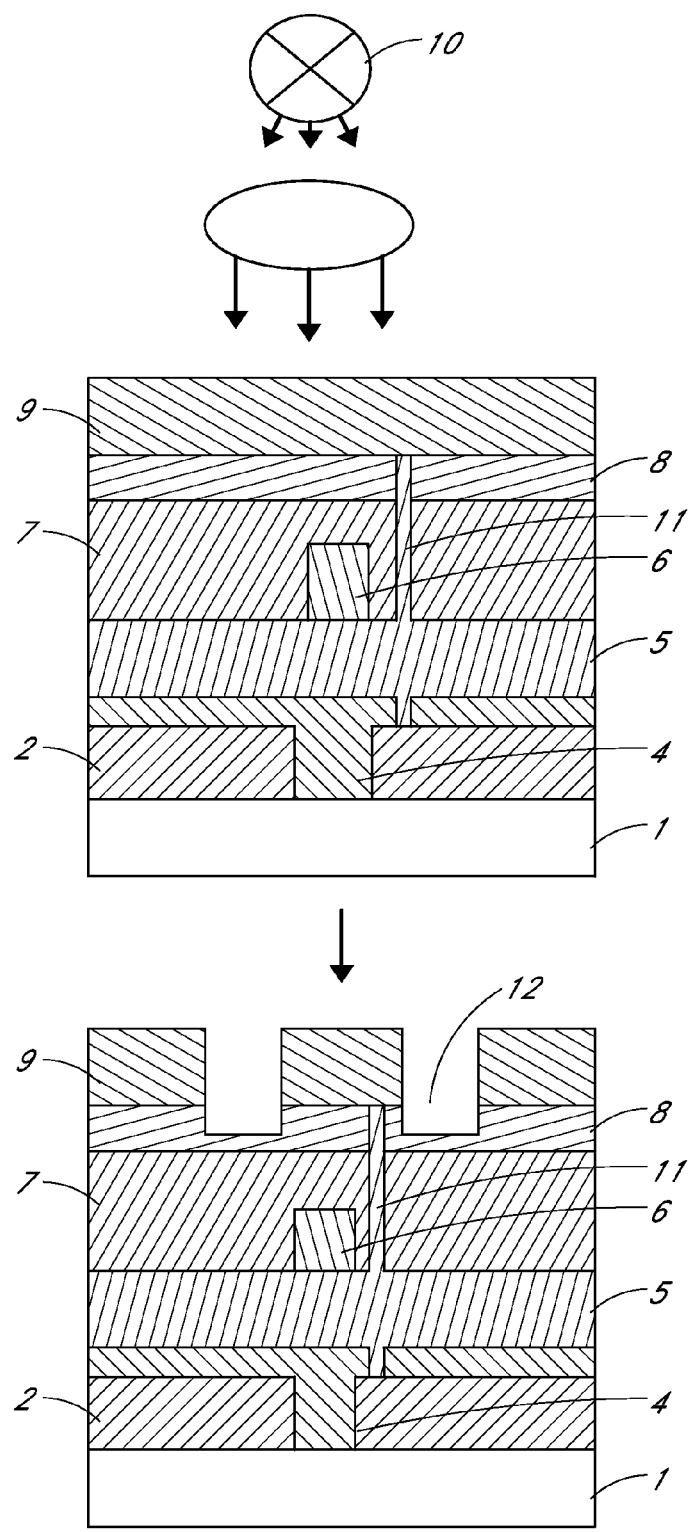
FIG. 2 shows a method for defining the upper pixel electrode on top of a multi-level pixel structure wherein, an insulating layer underneath the organic conductor layer contains a moiety which absorbs IR radiation.

FIG. 2 illustrates a first embodiment of the present invention. In this and later examples like elements to those of FIG. 1 are indicated by like reference numerals. The top conductive layer for the pixel electrode is defined by the division of conductive layer to produce separate electrode pads on a polymer surface, and therefore creating devices with mutually isolated pixel electrode lines. An insulating wetting layer 8, which contains a dye, that absorbs IR radiation, is deposited on top of the second dielectric 7. The material of the insulating layer may be deposited from solution in the form of a continuous layer using techniques such as, but not limited to, spincoating, ink-jet printing, spray-coating, roller coating spray or blade coating. However, preferably, the technique of spray coating is used. As stated above for the dielectric layers, this insulating layer is deposited in such a way so as to inhibit degradation of the underlying layers. The insulating layer preferably has a surface energy which provides good wetting and adhesion for the deposition of an conductive material 9. Preferably the conductive material is deposited as a thin continuous film by techniques such as, but not limited to inkjet printing, offset printing, blade coating or dip coating, curtain coating, meniscus coating, spray coating, or extrusion coating, The top conductive layer is preferably a conducting polymer such as PEDOT/PSS.

The stack may be irradiated with an infrared laser beam 10 such that the absorbing layer melts or ablates away. This step removes a conductive pathway between two adjacent electrode pads resulting in their isolation. The size of the non-conductive channels 12 produced between the resultant conductive pads is determined by the spot size of the laser beam.

An example of the insulating wetting layer 8 and IR absorbing moiety is poly (4-vinylphenol) (PVP) with the infrared dye SDA4927 added. This mixture is soluble in methanol which allows it to be processed from solution.

Figure 3:
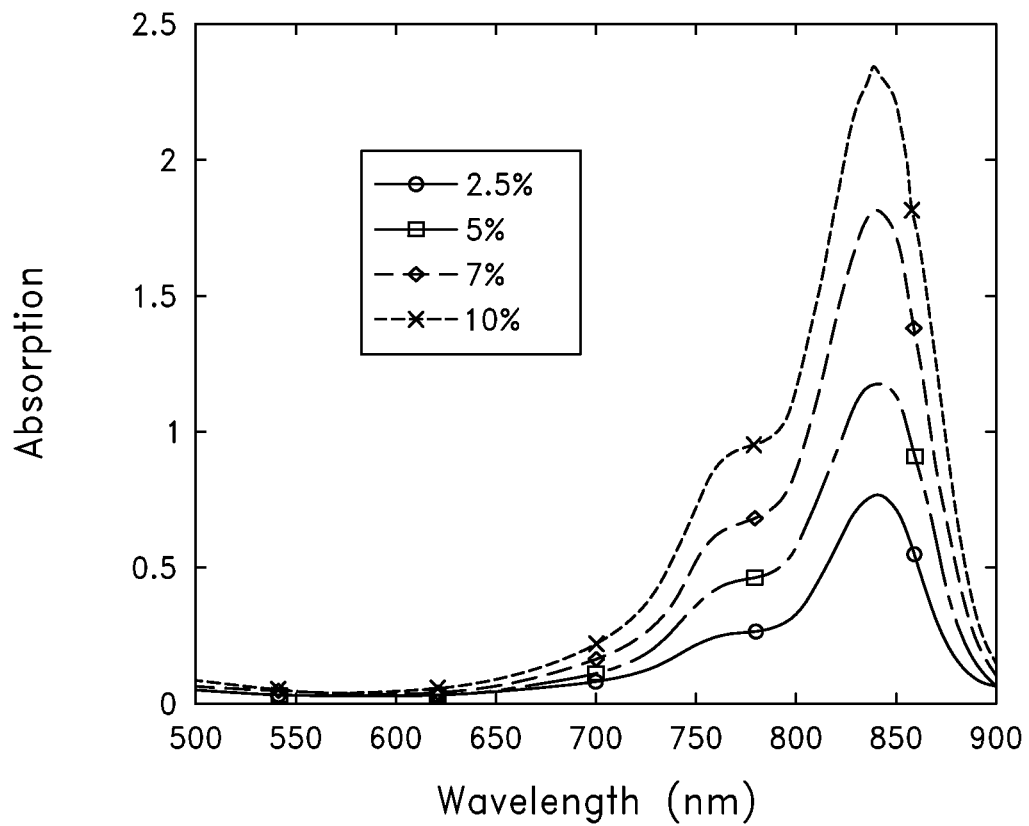
FIG. 3 shows an absorption spectra for PVP films mixed with various concentrations (in wt %) of the IR dye SDA4927.

The optical absorption spectra of 1.3 µm thick films of PVP with various concentrations of the dye are shown in FIG. 3. As an example, 20 µm lines were cut into these films by irradiating them with an infrared laser with 832 nm radiation. A fluency of 2031 mJ/cm$^2$ was used for this experiment. Subsequent measurements showed that the depth of the line varied as a function of dye concentration, with 700 nm deep lines seen in the film with 10 wt % dye and film and only 250 nm gaps deep lines seen in the film with 2.5 wt % dye. The fact that the depth of the line correlates to the concentration of dye shows how this ablation step can be self-limiting.

Figure 4A:
FIG. 4 shows images of PVP films mixed with (a) 2.5 wt % and (b) 10 wt % IR dye SDA4927 on a blank glass substrate coated with the organic conductor PEDOT/PSS in which organic electrodes have been isolated by ablating 20 µm wide lines with an IR laser.
Figure 4B:
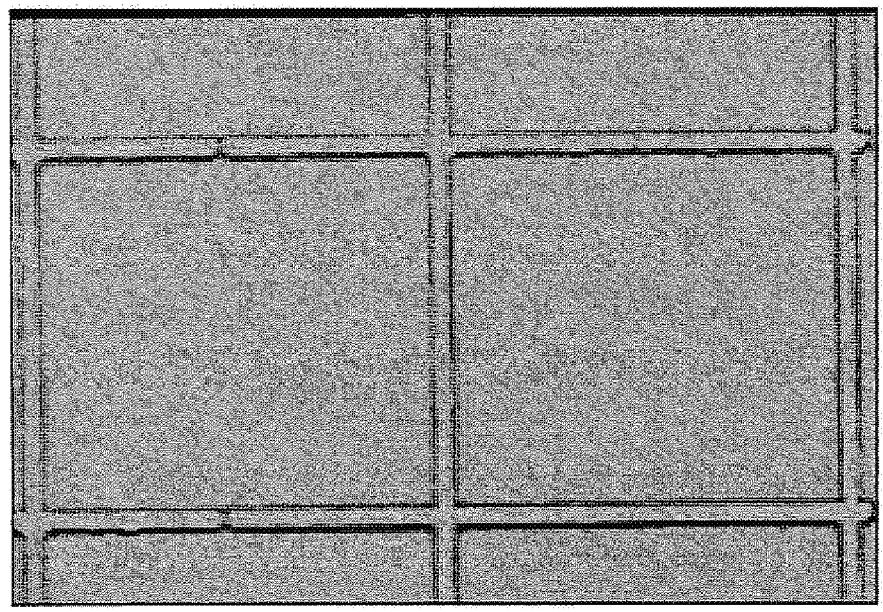

FIG. 4 shows images of a stack of an absorbing layer of PVP with 2.5 wt % and 10 wt % SDA4927 and a film of the organic conductor PEDOT/PSS. Isolated electrodes were formed using the same laser radiation as above. These images show that no excess debris is formed during this ablation step.

A PVP film was loaded with SDA4927 and deposited on top of a second dielectric of a substrate in which an array of multi-level polymer transistors were already fabricated. After cutting a via hole 11 through all the layers to the drain electrode the panel was coated with PEDOT/PSS by spin coating.

Figure 5:
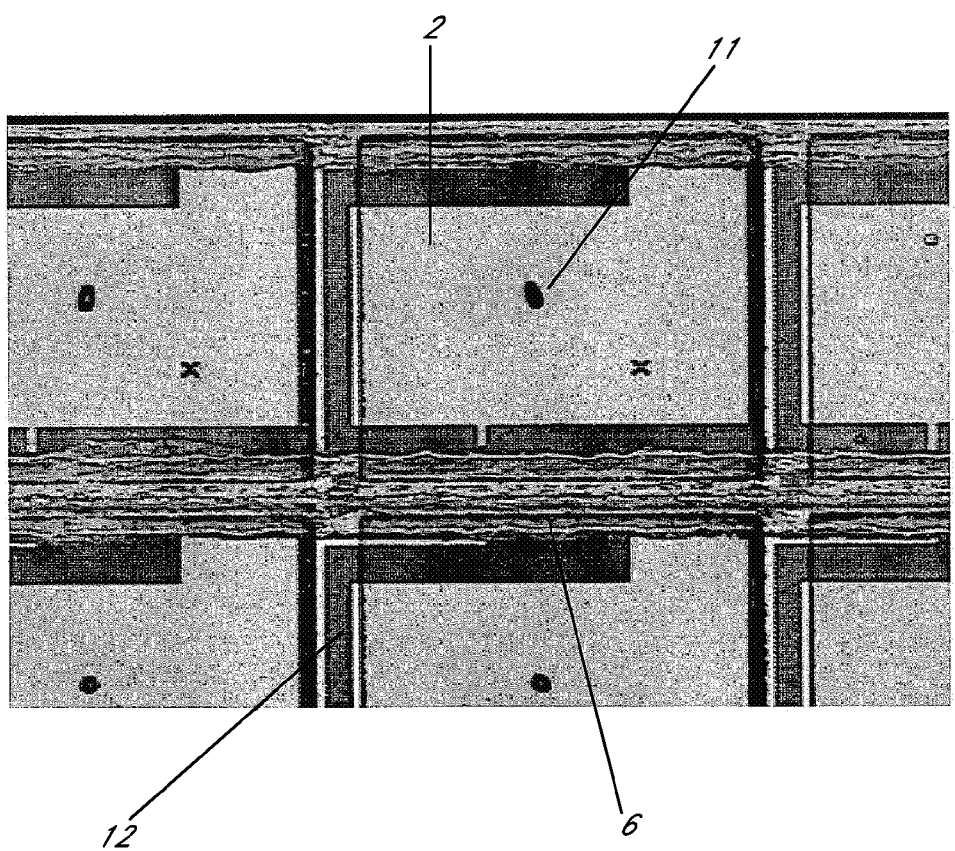
FIG. 5 illustrates a top view of a multi-level polymer stack with isolated upper pixel electrodes.

FIG. 5 shows a top view of a substrate after it was irradiated with 832 nm radiation with a fluency of 2031 mJ/cm$^2$ to form 40 μm non-conductive gaps in the PEDOT/PSS layer, showing drain/source electrode material 2, gate electrode 6, via 11 and laser patterning trenches 12. The laser irradiated and ablated regions extend over the area of the transistor devices underneath. Nevertheless, no degradation of the TFT device characteristics upon laser patterning of the top electrode was observed.

The process can be seen to result in clean separation of the pixel electrodes without significant generation of debris or particles in the vicinity of the gap. This is believed to be due to the large wavelength/small energy of the IR laser beam. Depending upon laser power, rather than ablating material from the substrate the infrared beam may only melt the conductive material and/or the light absorbing wetting layer in the exposed regions, this being followed by de-wetting of the molten material and subsequent opening of an electrically insulating gap.

Preferably, the optical density of the IR absorbing layer is higher than 0.3-0.5.

Example 3

Figure 6:
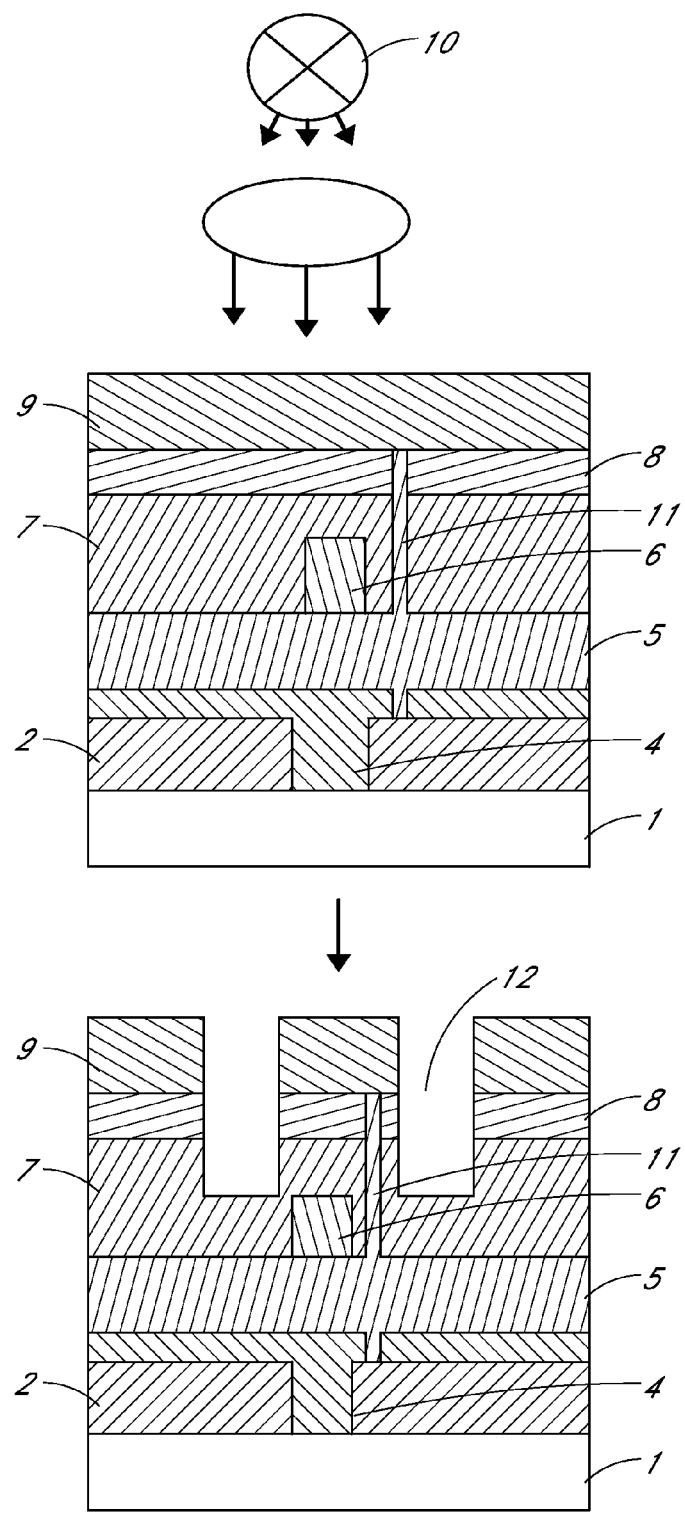
FIG. 6 illustrates a method for defining the upper pixel electrode on top of a multi-level pixel structure wherein an insulating layer with the IR absorbing moiety is separated from organic conductor by a non-absorbing wetting layer.

Patterning of Top Conductive Layer by Using an Optically Thick Dielectric Layer and Infrared Light FIG. 6 illustrates a variant of a process based on the first embodiment wherein the IR absorbing moiety is added to a thick dielectric material. The second dielectric layer 7, which has an added moiety which absorbs IR radiation, is deposited on top of gate interconnect 6. The material of the second dielectric layer may be deposited from solution in the form of a continuous layer using techniques such as, but not limited to, spincoating, inkjet printing, spray-coating, roller coating spray or blade coating. However, preferably, the technique of spray coating is used. The dielectric material may also be deposited using vapour phase deposition techniques like evaporation or chemical vapour deposition. As is described above for the first embodiment, and is referred to in WO01/47043, the material of the dielectric layer is preferably deposited in such a way so as to inhibit degradation to the underlying layers. If the second dielectric layer does not provide good wetting and adhesion for the deposition of the organic conductive material 9, than an additional insulating/wetting layer 8 can be used to facilitate the deposition of the layer of organic conductor material. An example of a material that may be used for the wetting layer is polyvinylphenol. This polymer is soluble in polar solvents, such as methanol or isopropanol. This layer is preferably thin, for example in the region of 30 nm in order to facilitate patterning of the conductive layer on top with the laser radiation absorbed in the dielectric layer.

The stack is irradiated with an infrared laser beam 10 such that the absorbing layer melts or ablates away. This step removes a conductive pathway 12 between two adjacent electrode pads resulting in their isolation. An example of a solution processible dielectric material is polystyrene mixed with a suitable infrared dye (SDA4554). This mixture is soluble in apolar solvents such as xylene and shows an absorption peak around 832 nm. When 832 nm radiation source with a fluency of 2031 mJ/cm$^2$ is used for the isolation process, it was found that the optical density of a four micron film of this material must be greater than 0.5 before significant material is removed, for other materials/fluences a lower OD may suffice.

Example 4

Figure 7:
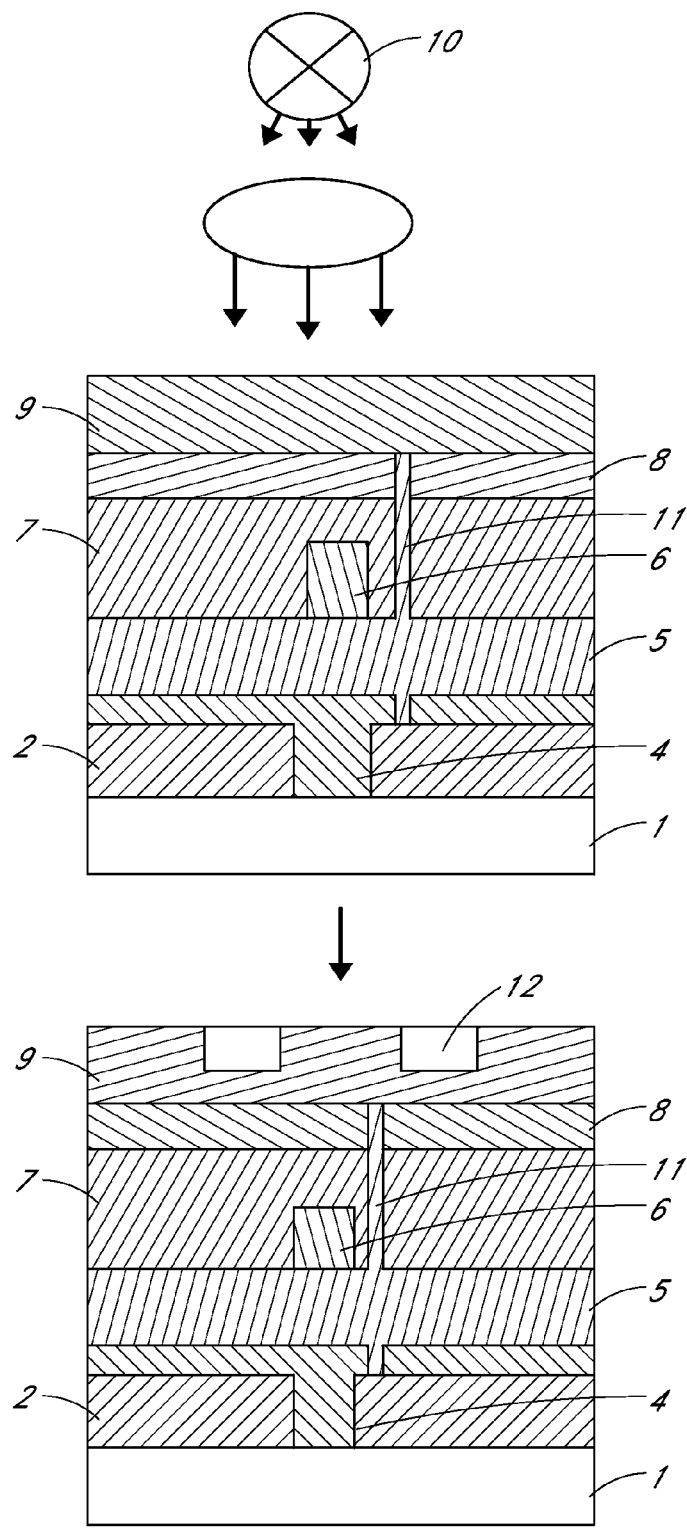
FIG. 7 illustrates a method for defining the upper pixel electrode on top of a multi-level pixel structure wherein, a conductive layer is provided with a moiety which absorbs IR radiation.

Patterning of the Top Conductive Layer by Using a Light Absorbing Conductive Layer In a second embodiment of the invention, as illustrated in FIG. 7, a pixel electrode is defined by the isolation of electrode pads on a polymer surface by providing a layer of conductive material 9 that contains an IR absorbing moiety. The conductive material with added IR absorbing moiety is deposited on the top of the layered substrate. The stack may then be irradiated by an infrared laser beam such that the regions of the layer containing the absorbing material melts or ablates away. This step removes any conductive pathways between two adjacent electrode pads resulting in the isolation of the device.

When the multi-level stack is irradiated with infrared radiation 10, the conductive layer is ablated or melted, such that non-conductive channels 12 are formed within the conductive layer when exposed to infrared radiation. The radiation source 10 is selected such that it is absorbed by the chemical moieties within the conductive layer. As stated above, the size of the non-conductive channels between the conductive pads is determined by the spot size of the laser beam.

The result of removing material within a conductive layer is achieved by conducting the aforementioned method as described in the above embodiment. This process may be carried out without the production of excess debris, which would lead to shorts within the device.

Example 5

Figure 8:
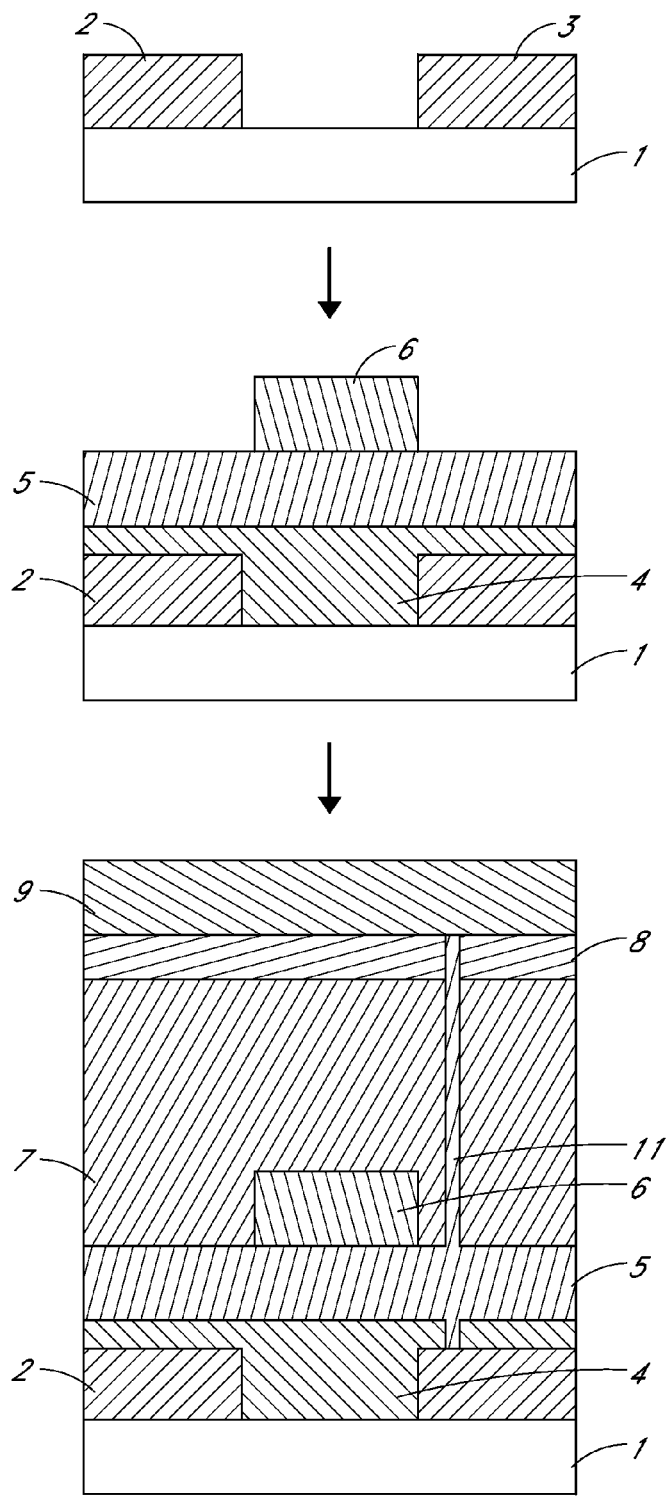
FIG. 8 illustrates a method of producing a multi-level polymer stack, incorporating a thick dielectric layer to allow for incomplete penetration by a UV laser beam.

Patterning of the Top Conductive Layer by Using an Optically Thick Dielectric and Ultraviolet Light In the third embodiment of the invention, as illustrated in FIG. 8, a pixel electrode is defined by the isolation of electrode pads on a polymer surface by providing a thick dielectric layer 7 deposited on top of the gate electrode.

Figure 9:
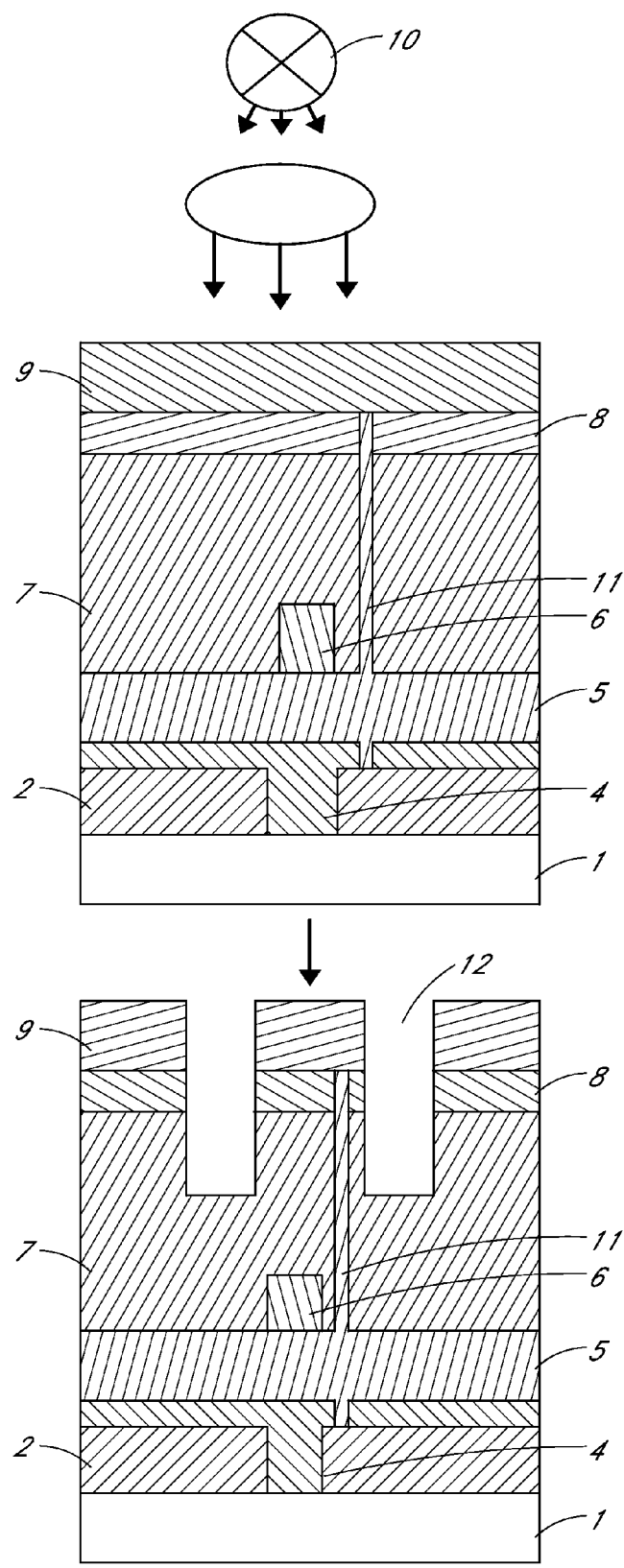
FIG. 9 illustrates a method for defining the upper pixel electrode on top of a multi-level pixel structure wherein, the dielectric layer is irradiated using a UV laser beam.

Referring now to FIG. 9, the stack may then be irradiated by an ultraviolet laser beam such that regions of the aforementioned dielectric layer melts or ablates away. The wavelength of the ultraviolet laser beam is chosen such that it is absorbed in the dielectric layer 7. The dielectric layer provided is optically thick, such that the ultraviolet laser light does not completely penetrate the layer for example less than 10%, 1% or 0.1% of the light emerging. The underlying layers are therefore protected. This step removes conductive pathways between two adjacent electrode pads resulting in the isolation of the device.

As stated above, the material of the second dielectric layer 7 may be deposited on top of the gate electrode 6 from solution in the form of a continuous layer using techniques such as, but not limited to, spincoating, ink-jet printing, spray-coating, roller coating spray or blade coating. However, preferably, the technique of spray coating is used. The dielectric material may also be deposited using vapour phase deposition techniques like evaporation or chemical vapour deposition. As is described above for the first embodiment, and is referred to in our previous patent (WO01/47043), the material of the dielectric layer should be deposited in such a way so as to not cause any degradation to the underlying layers. If the second dielectric layer does not have a surface energy which allows for the deposition of the organic conductive material 10, than an additional insulating wetting layer 8 can be used to facilitate the deposition of the organic conductor. An example of this material that may be used for the wetting layer is polyvinylphenol. A via hole is then made (as described above) through the multilayered stack to provide an avenue for the upper pixel electrode to contact to drain electrode of the TFT.

Preferably the thickness of said dielectric layer is equal to or greater than 1 micron, in order to reduce laser damage to the underlying organic electronic device during patterning.

In this embodiment, an ultraviolet laser 10 is used to ablate through the layer of organic conductor material and into the second dielectric layer to isolate the top pixel. As previously stated, solution-processible polystyrene dissolved in xylene and/or parylene and processed from a chemical vapour phase deposition technique are suitable for this layer. However, it is important that the second dielectric layer is thick enough to prevent the ultraviolet radiation from causing significant degradation to the underlying TFT layers. The conducting material for the top pixel electrode is preferably a conducting polymer such as PEDOT/PSS which provides efficient absorption at UV wavelengths (for example 248 nm) without having to add a dye component, and exhibits sufficiently low ablation threshold that degradation of underlying layers can be minimized. In this way the laser exposure dose can be adjusted such that only a thin portion of the underlying pixel dielectric is removed when patterning the top pixel electrode. Preferably the thickness of the pixel dielectric is larger than 3 mm, and the laser ablation of the PEDOT film is preferably performed in a single-shot exposure from a 248 nm excimer with a 30 nm pulse length. Preferably, the single shot process operates with a fluency between 100-800 mJ/cm$^2$.

Embodiments of the invention are applicable to a range of process conditions. For high laser intensities the conductive layer is ablated from the substrate. For low and medium laser intensities the conductive layer can only be melted. In the molten state it can de-wet from the substrate causing a break in the conductive path. The latter process condition can be preferable if generation of debris is to be avoided. The de-wetting of the conductive material can be encouraged by adjusting the interface energy between the conductive layer and the underlying layer on the substrate. A high interface tension will favour de-wetting when the conductive layer is hit by the laser beam.

The processes and devices described herein are not limited to devices fabricated with solution-processed polymers. Some of the conducting electrodes of the TFT and/or the interconnects in a circuit or display device (see below) may be formed from inorganic conductors, that can, for example, be deposited by the printing of a colloidal suspension or by electroplating onto a pre-patterned substrate. In devices where not all of the layers deposited from solution, one or more PEDOT/PSS portions of the device may be replaced with an insoluble conductive material such as a vacuum-deposited conductor.

In particular, the conducting material for the pixel electrode may comprise inorganic conductor, such as a solution-processible nanoparticle metal, such as gold, or metal precursor with which higher conductivities can be achieved than with conducting polymers. Alternatively, a thin film of a vacuum deposited or electroless plated metal can be used. However, in these cases the thickness of the metal layer is preferably thin, so as to reduce the laser energy required for patterning/ablation of the metal layer. Preferably the metal layer thickness is less than 200 nm, most preferably, less than 100 nm.

Examples of materials that may be used for the semiconducting layer, include any solution processible conjugated polymeric or oligomeric material that exhibits adequate field-effect mobilities exceeding $10^{-3}$ cm$^2$/Vs and preferably exceeding $10^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconducting nanowires.

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. However, ink-jet printing is considered to be particularly suitable for large area patterning with good registration, in particular for flexible plastic substrates. In the case of surface-energy direct deposition, materials may also be deposited by continuous film coating techniques such as spin, blade or dip coating, which are then able to be self-patterned by the surface energy pattern.

Although preferably all layers and components of the device and circuit are deposited and patterned by solution processing and printing techniques, one or, more components may also be deposited by vacuum deposition techniques and/or patterned by photolithographic processes.

Application of the invention does not only include patterning of top pixel electrodes for high aperture ratio active matrix displays. Embodiments can be applied to any device which requires patterning of a top conductive layer on top of a substrate which already contains active electronic devices. Examples of this are image sensors, such as X-ray image sensors, or multilayer interconnects for integrated logic circuits. Patterning processes, as described above, may also be used to pattern active and passive devices, for example other circuitry components such as, but not limited to, interconnects, resistors and capacitors. Similarly, the process can be applied to patterning of electrodes of devices with underlying sensitive layers, such as gate electrodes in a top-gate TFT, or source-drain electrodes in a bottom-gate TFT.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A method of patterning a top conductive layer on a substrate containing an array of organic thin film transistors, as active electronic devices, said patterned top conductive layer to form pixel electrodes for the array of organic thin film transistors in a multilayer device structure, the method comprising:

depositing a layer of insulating dielectric material on the active electronic devices to provide a dielectric layer, the layer of insulating dielectric material having a thickness of greater than 3 microns; and depositing a layer of conducting material over the dielectric material to provide the top conductive layer, the layer of conductive material being a metal layer of thickness less than 100 nm;

the method characterised by:

irradiating portions of the substrate with ultraviolet laser light, whereby portions of the top conductive layer are selective removed by melting or ablation from said irradiated substrate portions, the laser light being of a wavelength absorbed by dielectric material, such that a surface region of the layer of dielectric material is removed and significant degradation of the underlying array of the organic thin film transistors as active electronic devices, due to irradiation by the light, is prevented, and the dielectric layer remaining under the pixel electrodes as part of the multilayer device structure.

2. A method as claimed in claim 1 wherein said dielectric material comprises a polymer dielectric.

3. A method as claimed in claim 1 wherein said dielectric material has an optical density of at least 0.3 at a wavelength of said ultraviolet light.

4. A method as claimed in claim 1 wherein said dielectric material has a thermal conductivity of less than $10^{-2}$ W/cm·K.

5. A method as claimed in claim 1, the method further comprising providing a wetting interface or layer beneath said top conductive layer.

6. A method as claimed in claim 1, the method further comprising providing a de-wetting interface or layer beneath said top conductive layer.

7. A method of fabricating an active matrix display or image sensor, the method comprising:

forming a pixel electrode layer by patterning a top conductive layer on a substrate for the active matrix display or image sensor using the method of claim 1; and fabricating said active matrix display or image sensor using said substrate with said pixel electrode layer.

8. A method as claimed in claim 1 wherein less than 10% of the ultraviolet light penetrates the layer of dielectric material to material below the layer of dielectric material.

9. A method as claimed in claim 1 wherein less than 1% of the ultraviolet light penetrates the layer of dielectric material to material below the layer of dielectric material.

10. A method as claimed in claim 1 wherein less than 0.1% of the ultraviolet light penetrates the layer of dielectric material to material below the layer of dielectric material.

11. A method as claimed in claim 1 wherein said dielectric material has an optical density of at least 0.5 at a wavelength of the ultraviolet light.

12. A method of forming pixel electrodes on a substrate containing an array of organic thin film transistors in a multilayer device structure, the method comprising:

depositing a light absorbing dielectric layer on the array;

depositing a conducting metal layer over the dielectric material; and selectively removing portions of the metal layer, said selectively removing comprising melting or ablating a surface region of the dielectric layer underlying the portions of the metal layer by irradiating portions of the substrate with ultraviolet laser light having a wavelength absorbed by the dielectric layer, the dielectric layer having an optical density of at least 0.3 at the wavelength, such that a substantial portion of the dielectric layer remains under the pixel electrodes after said irradiating as part of the multilayer device structure while preventing significant degradation of the underlying array of organic thin film transistors from said irradiating.

13. A method as claimed in claim 12 wherein less than 10% of the ultraviolet laser light penetrates the dielectric layer to material below the dielectric layer.

14. A method as claimed in claim 12 wherein less than 1% of the ultraviolet laser light penetrates the dielectric layer to material below the dielectric layer.

15. A method as claimed in claim 12 wherein less than 0.1% of the ultraviolet laser light penetrates the dielectric layer to material below the dielectric layer.

16. A method as claimed in claim 12 wherein the dielectric material has an optical density of at least 0.5 at the wavelength.

* * * * *